(12) United States Patent
Yang

(10) Patent No.: US 7,435,621 B2
(45) Date of Patent: Oct. 14, 2008

(54) METHOD OF FABRICATING WAFER LEVEL PACKAGE

(75) Inventor: Kuo-Pin Yang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 185 days.

(21) Appl. No.: 11/416,078

(22) Filed: May 3, 2006

(65) Prior Publication Data

US 2006/0252230 A1    Nov. 9, 2006

(30) Foreign Application Priority Data

May 3, 2005    (TW) .............................. 94114290 A

(51) Int. Cl.
*H01L 21/00* (2006.01)
(52) U.S. Cl. ............... 438/110; 438/113; 257/E21.506; 257/E21.507
(58) Field of Classification Search ................. 438/110, 438/113; 257/E21.506, E21.507
See application file for complete search history.

(56) References Cited

U.S. PATENT DOCUMENTS 6,245,594 B1 * 6/2001 Wu et al. ................. 438/108

2002/0180013 A1 * 12/2002 Brofman et al. ............. 257/678
2004/0188837 A1 * 9/2004 Kim et al. ................... 257/738
2006/0046348 A1 * 3/2006 Kang ......................... 438/106

\* cited by examiner

*Primary Examiner*—Bradley W. Baumeister
*Assistant Examiner*—Julia Slutsker
(74) *Attorney, Agent, or Firm*—Bacon & Thomas PLLC

(57) ABSTRACT

A method of fabricating wafer level package is provided. First, a wafer having a front and a rear surfaces is provided. Several fosses are then formed on the front surface of the wafer. Next, an insulative layer is formed on a surface of each fosse; a conductive layer is then formed on part of the front surface of the wafer and the insulative layer of each fosse. A solder layer is formed on the conductive layer above each fosse. Afterward, a first substrate is attached to the front surface. Several holes are formed on the rear surface, and the holes baring the solder layer are positioned corresponding to the fosses. Then, a second substrate is attached to the rear surface of the wafer. The second substrate has several conductive pillars correspondingly inserted into the holes for connecting the solder layers. Next, the conductive structures are formed on the second substrate.

15 Claims, 3 Drawing Sheets

METHOD OF FABRICATING WAFER LEVEL PACKAGE

This application claims the benefit of Taiwan application Serial No. 94114290, filed May 3, 2005, the subject matter of which is incorporated herein by reference.

BACKGROUND OF THE INVENTION

1. Field of the Invention

The invention relates in general to a packaging method, and more particularly to a method of fabricating wafer level package.

2. Description of the Related Art

Along with the advance in electronic technology, high-tech electronic products become available in the market one after another. The main purpose of package industry is to support the research and development of electronic products and assure that the speed of semiconductor packages continues to increase, that the functions of the semiconductor packages are fully availed, and that the electronic products incorporating the semiconductor packages posses the advantages of slimness, lightweight and compactness. In order to meet these requirements, the development of the semiconductor packages is headed towards: increasing the number of input/output (I/O) pads, speeding the transmission of signals, boosting the power, shortening the pitches, increasing the connecting efficiency (the ratio of the size of the chip inside the package to the size of the package), lightening, thinning and miniaturizing the size. Apart from that, a package with good heat dissipation and multiple chips is also highly demanded.

Current markets of electronic products are focused on the feature of portability. For example, electronic products such as notebook computer and personal digital assistant (PDA) have gradually become indispensable electronic products to modern people. To be applicable to the high space density of mobile electronic products, the memory module needs to maintain high efficiency and stable quality. Therefore, how to reduce module space and yet remain high quality or even increase data transmission efficiency has become an imminent issue to be resolved. However, conventional chip level package technology is unable to meet the requirements of future technology, the current trend is headed towards wafer level package which possesses the advantages of low cost and high quality.

According to the technology of conventional chip level package, the chips are singulated from the wafer first and then the wafer is packaged using a molding compound and tested. The size of a packaged chip is larger than the size of a chip by 20%. According to the technology of wafer level package, the wafer is packaged and tested first before being singulated into chips, therefore the packaged chip has the same size with the chip. According to the technology of wafer level package, not only the size of memory module is reduced, but also the features of slimness, lightweight and compactness of portable electronic products can be satisfied. Besides, the circuit layout of wafer level package is shorter and thicker, thereby effectively increasing the bandwidth and stability of data transmission and reducing the loss of currents. Moreover, the wafer level package does not need the molding compound used in the technology of chip level package for the packing of plastics or ceramics, so that the heat generated by the chip is effectively dissipated, which is conducive to the resolution of heat dissipation problem of portable electronic products.

In terms of a conventional optical component, the circuit layout is mainly distributed on the front surface of the optical component, and the front surface is used for receiving external light source at the same time. When the optical component needs to be electrically connected to a substrate such as a substrate used for testing or a circuit board of an electronic product applying the same, the front surface of optical component is normally electrically connected to the substrate via wiring. The aforementioned method is applicable to the technology of chip level package, but is not applicable to the method of fabricating wafer level package. Therefore, how to apply the method of fabricating wafer level package to the aforementioned optical component so that the size is miniaturized, the data transmission is stabilized and the heat dissipation is enhanced has become an imminent challenge to be resolved.

SUMMARY OF THE INVENTION

It is therefore an object of the invention to provide a method of fabricating wafer level package, so that the wafer level package unit possesses excellent quality. The circuits on the front surface of the wafer are conducted to the rear surface of the wafer. The rear surface of the wafer is electrically connected to an external substrate, so that the front surface of the wafer still can receives signals from an external light source.

The invention achieves the above-identified object by providing a method of fabricating wafer level package. First, a wafer having a front surface and a rear surface is provided. Several fosses are then formed on the front surface of the wafer. Next, an insulative layer is formed on a surface of each fosse; a conductive layer is then formed on part of the front surface of the wafer and the insulative layer of each fosse. A solder layer is formed on the conductive layer above each fosse. Afterward, a first substrate is attached to the front surface of the wafer. Several holes are formed on the rear surface of the wafer, and the holes are positioned corresponding to the fosses. Each hole bares the solder layer. Then, a second substrate is attached to the rear surface of the wafer. The second substrate has a plurality of conductive pillars correspondingly inserted into the holes for connecting the solder layers. Next, a plurality of conductive structures is formed on the second substrate.

Other objects, features, and advantages of the invention will become apparent from the following detailed description of the preferred but non-limiting embodiments. The following description is made with reference to the accompanying drawings.

DETAILED DESCRIPTION OF THE INVENTION

The invention provides a method of fabricating wafer level package. The main concept is to connect the circuits on the front surface of an optical component to the rear surface of the optical component and use the rear surface of the optical component as a contact point of the optical component, so that the front surface of the optical component still can receives signals from an external light source. Singulation is processed after the wafer is packaged. Then the singulated package unit is electrically connected to an external substrate, such as a substrate used for testing or a circuit board of an electronic product applying the same.

Figure 1A:
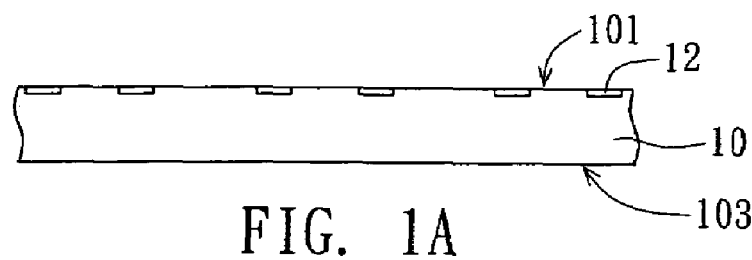
FIGS. 1A~1L schematically illustrate a method of fabricating wafer level package according to a preferred embodiment of the invention.
Figure 1B:
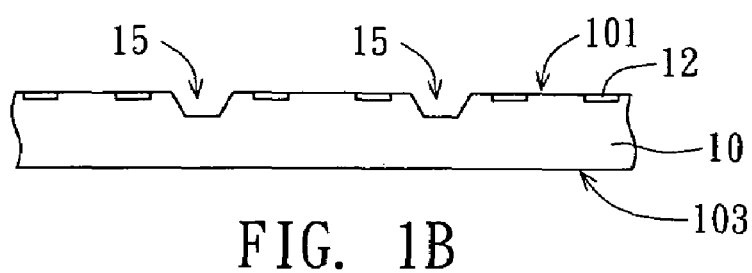

FIGS. 1A~1L schematically illustrate a method of fabricating wafer level package according to a preferred embodiment of the invention. Firstly, a wafer 10 having a front surface 101 and a rear surface 103 is provided. The front surface 101 of the wafer 10 has several conductive pads 12 as shown in FIG. 1A. The conductive pads 12 are the input/output (I/O) pads of wafer level package. Besides, the front surface 101 can be used for receiving an external light source. Afterwards, several fosses 15 are formed on the front surface 101 of the wafer 10, as shown in FIG. 1B. The positions of the fosses 15 are corresponding to two sides of the chips (shown in FIG. 1H, and reference number 104). Practically, the fosses 15 can be formed by etching or other cutting process.

Figure 1C:
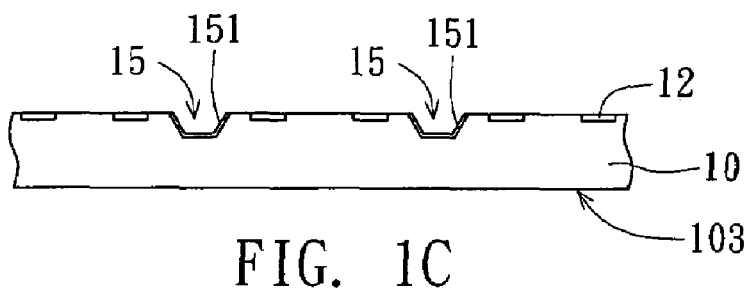
Figure 1D:
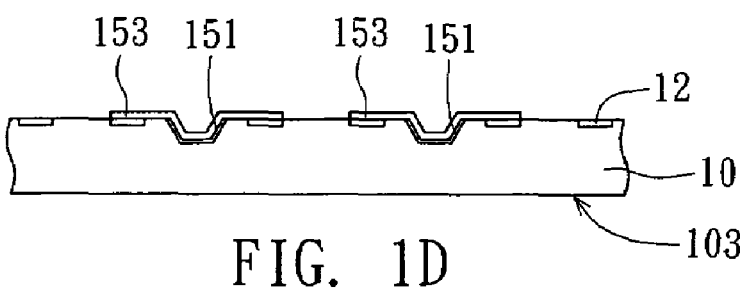
Figure 1E:
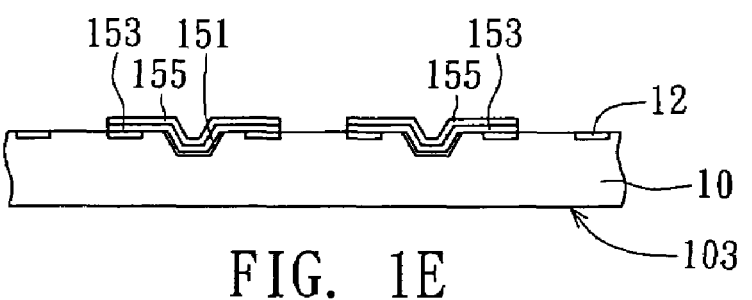

Next, an insulative layer 151 is formed on the surface of each fosse 15, as shown in FIG. 1C. The insulative layer 151 could be made of any insulated dielectric material. A conductive layer 153 is then formed on part of the front surface 101 of the wafer 101 and covers the insulative layer 151, as shown in FIG. 1D. The conductive layer 153 can be any conductive material such as metal and formed by sputtering and etching. Subsequently, a soldering layer 155 is formed on the conductive layer 153, as shown in FIG. 1E.

The conductive layer 153 is also known as under bump metallization (UBM). UBM, usually consisting of a multi-layer metal stack in the practical application (such as two metallic thin films), provides the critical interface between the metal pad of the IC and the solder bump used for the flip chip interconnect to the substrate. For example, the first layer of metal stack used as an adhesion/diffusion barrier layer is commonly made of titanium (Ti) or titanium/tungsten (Ti/W). The first layer of metal stack provides the adhesion to the wafer passivation and low resistance contact between the metal pad and the bump. The second layer of metal stack, such as an Au thin film, functions as the effective barrier to solder diffusion into the metal pad and can be used as a seed layer for Au plating. Accordingly, adapting UBM as the conductive layer 153 in FIG. 1E has the advantages of low stress, good adhesive ability and high corrosion resistance.

Figure 1F:
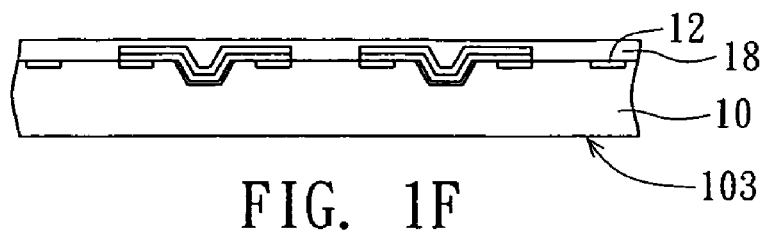

After forming the soldering layer 155, a first adhesive layer 18 is coated on the front surface 101 of the wafer 10, as shown in FIG. 1F. The first adhesive layer 18 covers the soldering layer 155 and fills the fosses 15. Practically, an optical adhesive (such as epoxy) having high transparency and refraction can be selected for being the material of the first adhesive layer 18.

Figure 1G:
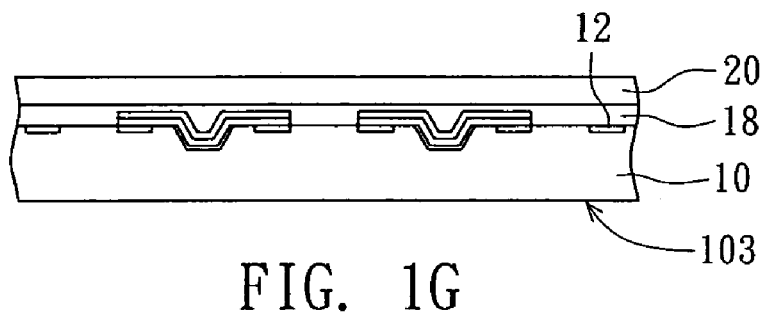

Next, a first substrate 20 (such as a glass) is attached on the first adhesive layer 18, as shown in FIG. 1G. If the optical adhesive is selected for being the first adhesive layer 18, for example, the first substrate 20 affixes to the front surface 101 of the wafer 10 by curing the first adhesive layer 18.

Figure 1H:
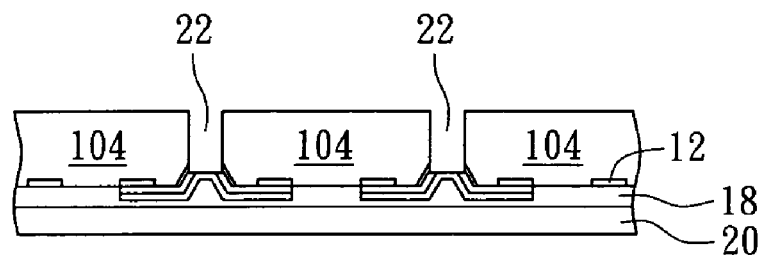

Next, several holes 22 are formed on the rear surface 103 of the wafer 10, and the holes 22 bare the soldering layer 155, as shown in FIG. 1H. The holes 22 are positioned between the chips 104. The holes 22 can be formed by using an etching process or other cutting process.

Figure 1I:
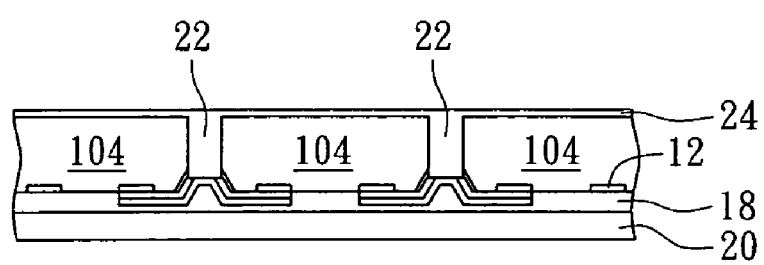

Afterwards, a second adhesive layer 24 is coated on the rear surface 103 of the wafer 10 and fills the holes 22, as shown in FIG. 1I.

Figure 1J:
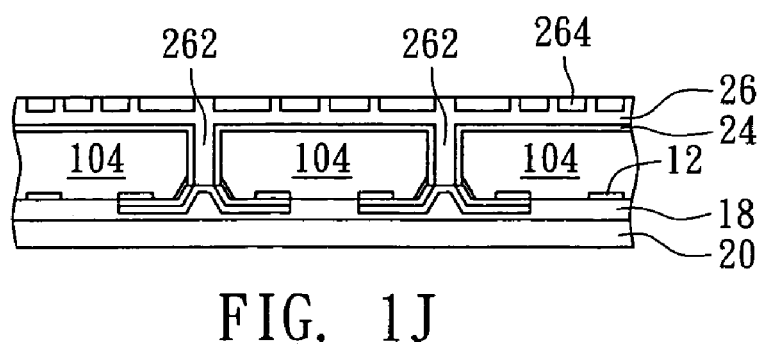

A second substrate 26 with several conductive pillars 262 is formed on the second adhesive layer 24. Also, the conductive pillars 262 are correspondingly inserted into the holes 22, as shown in FIG. 1J. The conductive pillars 262 are fixed by the second adhesive layer 24 loaded in the holes 22. Also, the second substrate 26 has several contact pads 264. In a practical application, the second substrate 26 can be made of glass, and the optical adhesive (such as epoxy) having high transparency and refraction can be applied as the second adhesive layer 24.

Figure 1K:
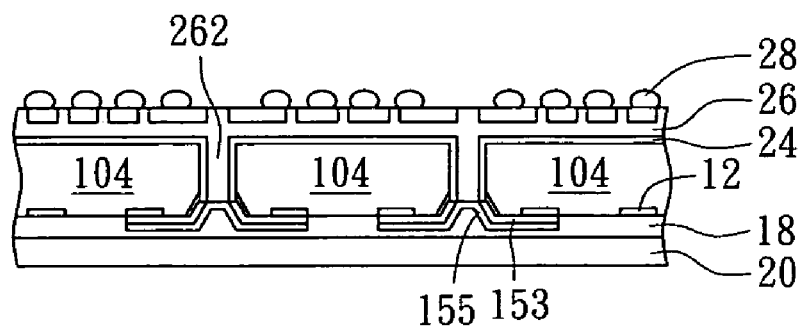
Figure 1L:
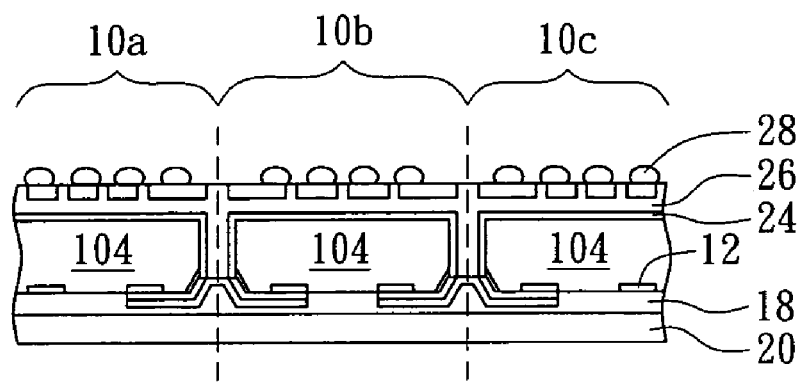

Next, several conductive structures 28 such as the solder bumps are formed on the contact pads 264 of the second substrate 28, as shown in FIG. 1K. The conductive structures 28 can be electrically connected to a circuit board (not shown in the figures). The package of FIG. 1K is then singulated into several package units, such as the package units 10a, 10b, 10c shown in FIG. 1L.

Figure 2:
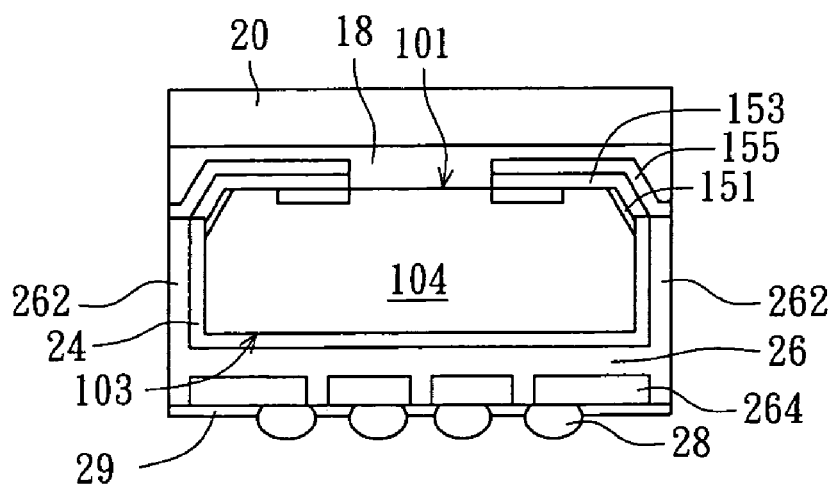
FIG. 2 schematically illustrates a wafer level package unit manufactured according to the preferred embodiment of the present invention.

FIG. 2 schematically illustrates a wafer level package unit manufactured according to the preferred embodiment of the present invention. In the package unit, the first substrate 20 and the second substrate 26 are disposed on the upper side and the lower side of the chip 104, respectively. Also, the first substrate 20 and the second substrate 26 are attached to the chip 104 by the first adhesive layer 18 and the second adhesive layer 24, respectively. The conductive pillars 262 positioned on two sides of the chip 104 are used for the electrical connection between the front surface 101 and the rear surface 103 of the wafer 10. The second adhesive layer 24 positioned between the conductive pillars 262 and the chip 104 protects the circuits from moisture damage. Also, the conductive pillars 262 connect the conductive pad (I/O pad) 12 (FIG. 1L) positioned on the front surface 101 to the rear surface 103. Besides, a solder mask 29 can be further formed on the second substrate 26. After the conductive structures 28 are formed, the solder mask 29 can protect the exposed portions of the contact pads 264 of the second substrate 26. The package unit can be electrically connected to an external substrate (not shown in the FIG. 2) via the conductive structures 26 (such as the solder bumps) positioned at the rear surface 103. Examples of the external substrate include a substrate used for function test, or a printed circuit board of an electronic product to which the package unit is applied.

The wafer level package units fabricated according to the aforementioned method of the embodiment possess the following advantages:

(1) The fosses 15 can be formed on the front surface 101 of the wafer 10 by etching or cutting, for facilitating the attachment between the first substrate 20 and the front surface 101 of the wafer 10. The first substrate 20 can be used as a supporter, for facilitating formation of the hole 22 on the rear surface 103 of the wafer 10. Also, the hole 22 correspondingly connects the fosse 15.

(2) The front surface 101 of the wafer 10 is a photosensitive region. The front surface 101 of the wafer 10 has been protected by the first substrate 20 before attachment of the second substrate 26 is performed. Accordingly, the possibility of contaminating the photosensitive region during the subsequent manufacturing processes can be greatly decreased.

(3) The conductive pillar 262 positioned on the second substrate 26 and inserted into the holes 22 connect the conductive layer 153 in the fosse 15, so that an electrical circuit is constructed between the front surface 101 and the rear surface 103 of the wafer 10.

(4) By filling the adhesive (such as the first adhesive layer 18 and the second adhesive layer 24) around the chip 104, the electrical circuits of the package unit are protected from the moisture damage.

A miniaturized and qualified wafer level package unit possessing the features of stable circuits and excellent dissipation and capable of resisting vapor damage can be manufactured according to the aforementioned method of fabricating wafer level package. Since the steps of the manufacturing process are simple, the manufacturing cost of the wafer level package unit can be greatly decreased.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating wafer level package, comprising:
   providing a wafer having a front surface and a rear surface;
   forming a plurality of fosses on the front surface of the wafer;
   forming an insulating layer on a surface of each fosse;
   forming a conductive layer on part of the front surface of the wafer and the insulating layer of each fosse;
   forming a solder layer on the conductive layer above each fosse;
   attaching a first substrate to the front surface of the wafer;
   forming a plurality of holes on the rear surface of the wafer, and the holes positioned corresponding to the fosses, and each hole baring the solder layer;
   attaching a second substrate to the rear surface of the wafer, and the second substrate having a plurality of conductive pillars correspondingly inserted into the holes for connecting the solder layers; and
   forming a plurality of conductive structures on the second substrate.

2. The method according to claim 1, wherein the fosses are formed on the front surface of the wafer by an etching process or a cutting technique.

3. The method according to claim 1, wherein the insulating layer is formed by sputtering.

4. The method according to claim 1, wherein the step of attaching the first substrate to the front surface of the wafer comprises:
   forming a first adhesive layer on the front surface of the wafer, and the first adhesive layer covering the fosses;
   disposing the first substrate on the first adhesive layer; and
   curing the first adhesive layer.

5. The method according to claim 4, wherein the first adhesive layer is an optical adhesive.

6. The method according to claim 5, wherein the optical adhesive is epoxy.

7. The method according to claim 4, wherein after forming the holes on the rear surface of the wafer, a second adhesive layer is coated on the rear surface of the wafer and fills the holes.

8. The method according to claim 1, further comprising:
   singulating the package into a plurality of units.

9. The method according to claim 1, wherein the first substrate includes a glass.

10. The method according to claim 1, wherein the second substrate includes a glass.

11. The method according to claim 1, wherein the holes are formed by an etching process.

12. The method according to claim 1, wherein the second substrate has a plurality of contact pads, and the conductive structures are formed on the contact pads.

13. The method according to claim 1, wherein the conductive structures include a plurality of solder bumps.

14. The method according to claim 8, wherein the step of singulating the package comprising:
   cutting the package along a central line of each of the conductive pillars to form the units.

15. The method according to claim 1, wherein the wafer includes a plurality of conductive pads, in the step of forming the plurality of fosses, each of the fosses is formed between two of the adjacent conductive pads, and in the step of forming the conductive layer, the conductive layer is formed on the two adjacent conductive pads and the area between the two adjacent conductive pads.

* * * * *